US012595556B2

(12) United States Patent
Beppu et al.

(10) Patent No.: US 12,595,556 B2
(45) Date of Patent: Apr. 7, 2026

(54) MOLYBDENUM IMIDO ALKYL/ALLYL COMPLEXES FOR DEPOSITION OF MOLYBDENUM-CONTAINING FILMS

(71) Applicant: L'Air Liquide, Société Anonyme pour l'Etude et l'Exploitation des Procédés Georges Claude, Paris (FR)

(72) Inventors: Teruo Beppu, Yokosuka (JP); Yuki Ito, Yokosuka (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 476 days.

(21) Appl. No.: 18/116,506

(22) Filed: Mar. 2, 2023

(65) Prior Publication Data

US 2024/0301548 A1 Sep. 12, 2024

(51) Int. Cl.
*C23C 16/18* (2006.01)
*C23C 16/448* (2006.01)

(52) U.S. Cl.
CPC .......... *C23C 16/18* (2013.01); *C23C 16/4481* (2013.01)

(58) Field of Classification Search
CPC ........................................................ C23C 16/18
See application file for complete search history.

(56) References Cited

U.S. PATENT DOCUMENTS

| | | | |
|---|---|---|---|
| 2007/0160761 | A1 | 7/2007 | Reuter et al. |
| 2014/0141165 | A1 | 5/2014 | Sato et al. |
| 2016/0002786 | A1 | 1/2016 | Gatineau et al. |
| 2017/0268107 | A1 | 9/2017 | Lansalot-Matras et al. |
| 2018/0286668 | A1 | 10/2018 | Baum et al. |
| 2019/0067003 | A1 | 2/2019 | Zope et al. |
| 2019/0390340 | A1 | 12/2019 | Yu et al. |
| 2020/0115798 | A1 | 4/2020 | Wright, Jr. et al. |
| 2020/0199743 | A1 | 6/2020 | Wright, Jr. et al. |
| 2020/0332416 | A1 | 10/2020 | Fluit |
| 2021/0062331 | A1 | 3/2021 | Chen et al. |
| 2021/0300955 | A1 | 9/2021 | Park et al. |
| 2022/0372053 | A1 | 11/2022 | Arteaga Muller et al. |

FOREIGN PATENT DOCUMENTS

| | | |
|---|---|---|
| CN | 115448954 | 12/2022 |
| JP | H03 111570 | 5/1991 |
| JP | H07 258390 | 10/1995 |
| JP | 2000 281712 | 10/2000 |
| JP | 2007 182443 | 7/2007 |
| JP | 2012 246531 | 12/2012 |
| JP | 2016 516892 | 6/2016 |
| JP | 2017 525156 | 8/2017 |
| KR | 2021 0019682 | 2/2021 |
| WO | WO 2013 112383 | 8/2013 |
| WO | WO 2018 013778 | 1/2018 |
| WO | WO 2018 191183 | 10/2018 |
| WO | WO 2019 213604 | 11/2019 |
| WO | WO 2020 214732 | 10/2020 |
| WO | WO 2021 046058 | 3/2021 |
| WO | WO 2021 076636 | 4/2021 |
| WO | WO 2023 282615 | 1/2023 |

OTHER PUBLICATIONS

Sues et al. CAS: 164:326617, 2016.*
Wu et al. CAS: 172: 25440, 2019.*
Park et al. CAS: 176: 297501, 2021.*
Ortiz et al. CAS: 131: 351412, 1999.*
Teijin et al. CAS: 124: 88149, 1996.*
Cole et al. CAS: 130:25168, 1998.*
Radius, U. et al., Sigma- versus Pi-Koordination in Bis-indenyl- und Bis-2-methally-Imidokomplexen des sechswertigen Molybdans und Wolframs: DF-Rechnungen und Kristallstrukturanalyse, Z. Anorg. Allg. Chem. 2002, 628, 1126-1235 with English abstract.
Zydor, A. et al., TiCp+$(OMe)_3$ versus $Ti(OMe)_4$ in atomic layer deposition of $TiO_2$ with water—ab initio modelling of atomic layer deposition surface reactions.
Tang, Y. et al., Facile synthesis of $M(=NtBu)_2(CH_2SiMe_3)_2$ (M=Mo or W) as potential precursors for thin film deposition, Inorganic Chemistry Communications 151 (2023) 110284, 1-4.
International Search Report and Written Opinion for corresponding PCT/US2024/017954, May 21, 2024.
Andersen, R.A. et al., (Trimethylsilyl)methylidene and (trimethylsilyl)methylidyne compounds of molybdenum and tungsten: $(Me_3SiCH_2)_3Mo{\equiv}CHSiMe_3$ (M=Mo, W) and $(Me_3SiCH_2)_3Mo{=}CHSiMe_3$, Inorg. Chem. 1981, 20, 3934-3936.

(Continued)

*Primary Examiner* — Rei Tsang Shiao
(74) *Attorney, Agent, or Firm* — Allen E. White

(57) ABSTRACT

Disclosed is a chemical suitable for use as a volatile precursor for vapor phase depositions of Mo or Cr containing materials, the chemical represented by one of the following formulae:

a)

Formula I

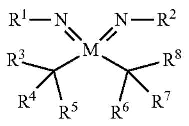

b)

Formula II

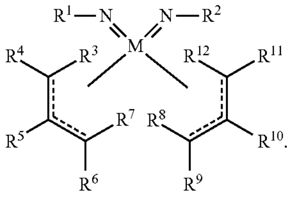

Use of the chemical for vapor phase depositions is demonstrated.

17 Claims, No Drawings

(56) References Cited

OTHER PUBLICATIONS

Bagratashvili, V.N. et al., UV laser photolysis of $Mo(CO)_6$ and molybdenum film deposition, Proceedings of SPIE, vol. 1352, International School on Laser Surface Microprocessing, 1989, Tashkent, Uzbekistan, 60-66.
Benn, R. et al., $\eta^3$-allyl complexes of tungsten—I. Preparation and reactions of $[(\eta^3\text{-}C_3H_5)_3\ WCI]_2$, Polyhedron vol. 9, No. 1, 1990, 11-22.
Bukhryakov, K.V. et al., Syntheses of molybdenum adamantylimido and t-butylimido alkylidene chloride complexes using HCI and diphenylmethylphosphine, Organometallics 2017, 36, 4208-4214.
Campos, J. et al., Methyl complexes of the transition metals, Angew. Chem. Int. Ed. 2016, 22, 6462-6457.
Carver, G.E., Chemically vapor deposited molybdenum films of high infrared reflectance, Thin Solid Films, 63 (1979) 169-174.
Chisholm, M.H. et al., The molybdenum-molybdenum triple bond. 11. 1,1- and 1,2-disubstituted dimolybdenum compounds of formula $Mo_2X_2(CH_2SiMe_3)_4$ (M≡M). Observation of rotation about the triple bond, Organometallics 1982, 1, 251-259.
Coles, M.P. et al., Synthesis and reactivity of the first stable chromium(vi) alkylidene complexes, Chem. Commun. 16, 1996, 1963-1964.
El Hoshy, A.H., Characterization of CVD molybdenum thin films, J. Electrochem. Soc., 118 (12) 1971, 2028-2031.
Gesheva, K.A. et al., Black molybdenum photothermal converter layers deposited by pyrolytic hydrogen reduction of $MoO_2Cl_2$, Solar Energy Materials 3 (1980) 415-424.
Gilbert, T.M. et al., Synthesis and electronic properties of triply bonded hexakis(fluoroalkoxy)dimolybdenum complexes. Structure of $Mo_2[OCMe(CF_3)_2]_6$ and investigation of the nature of the frontier orbitals in triply bonded $M_2X_6$ compounds, Inorg. Chem. 1992, 31, 3438-3444.
Herrmann, W.A. et al., Nitridotris(neopentyl)molybdenum(VI), J. Am. Chem. Soc. 1994, 116, 4989-4990.
Juppo, M. et al., Deposition of molybdenum thin films by an alternate supply of $MoCl_5$ and Zn, J. Vac. Sci. Technol. A 16(5), Sep./Oct. 1998, 2845-2950.
Kano, G. et al., Molybdenum-silicon Schottky barrier, Journal of Applied Physics, vol. 37, No. 8, Jul. 1996, 2985-2987.
Kaplan, L.H. et al., The deposition of molybdenum and tungsten films from vapor decomposition of carbonyls, J. Electrochem. Soc. 1970, 117, 683-700.
Kingsley, A.J., (1998) Studies in early transition metal organometallic chemistry, Durham theses, Durham Univ., downloaded from http://etheses.dur.ac.uk/4846/.
Meda, L. et al., Investigation of electrochromic properties of nanocrystalline tungsten oxide thin film, Thin Solid Films, 402 (2002) 126-130.
Odom, A.L. et al., Chromium(VI) nitrido complexes: Reactions with Bronsted acids and synthesis of organometallic derivatives, Polyhedron, 17 (5-6), Mar. 30, 1998, 675-688.
Ortiz, C.G. et al., Synthesis of chelate-supported dialkyl and alkyldene complexes of molybdenum(VI), Organometallics 1999, 18, 4253-4260.
Pilyugina, T.S. et al., Synthesis of molybdenum(VI) monoimido alkyl and aklylidene complexes, Organometallic 2005, 24, 1929-1937.
Roessler, B. et al., $[Mo(CH_3)_6]$ and $[Mo(CH_3)_7]$, Angew. Chem. Int. Ed, Apr. 3, 2000, 39 (7) 1259-1261.
Schoettel, G. et al., A simple route to molybdenum-carbene catalysts for alkene metathesis, J. Chem. Soc., Chem. Commun., 1989, 1062-1063.
Seghete, D. et al., Molybdenum atomic layer deposition using $MoF_6$ and $Si_2H_6$ as the reactants, Chem. Mater. 2011, 23, 1668-1678.
Simeonov, S.S. et al., Preparation of Mo—Si Schottky barriers by chemical vapour depositions of molybdenum onto epitaxial silicon substrates, Thin Solid Films, 115 (1984) 291-298.
Valente, A,A, et al., Dichloro and dimethyl dioxomolybdenum(VI)-diazabutadiene complexes as catalysts for the epoxidation of olefins, New Journal of Chemistry, 28 (2) 308-313.
Wu, P. et al., Synthesis, characterization, and reactivity of chromium(VI) alkylidenes, Organometallics 38 (24), Dec. 23, 2019, 4593-4600.
Xue, Z. et al., Molecular routes to metal-carbides, -nitrides, and -oxides. 3. Chemical vapor deposition employing $X_3W{\equiv}{}^*CCMe_3$, where $X{=}CH_2CMe_3$, $O^tBu$, and $O^tBu\text{-}d_9$ and $^*C{=}^{12}C$ or $^{13}C$, and a comparison with the chemistry of $(^tBuO)_3W{\equiv}N$, Chem. Mater. 1998, 10, 2365-2370.
Yagupsky, G. et al., Trimethylsilylmethyl compounds of transition metals, Chemical Communications, 1970 (20), 1369-1370.
Yasuda, K. et al., Molybdenum film formation by low pressure chemical vapor deposition, Japanese Journal of Applied Physics, vol. 22, No. 10, Oct. 1983, L615-L617.
Yoshikawa, N. et al., Chemical vapour deposition rate of Mo film in horizontal tubular reactor, Materials Transactions, JIM, vol. 38, No. 4 (1997), 292-298.
Zoubenko, E. et al., Impact of chemical bonding difference of ALD Mo on $SiO_2$ and $Al_2O_3$ on the effective work function of the two gate stacks, J. Vac. Sci. Technol. A 39, 043201 (2021).

* cited by examiner

MOLYBDENUM IMIDO ALKYL/ALLYL COMPLEXES FOR DEPOSITION OF MOLYBDENUM-CONTAINING FILMS

TECHNICAL FIELD

The field of the invention is volatile, metalorganic chemical suitable for use as precursors for vapor phase depositions of metal containing materials on surfaces, such as surface films and coating.

BACKGROUND OF THE INVENTION

Molybdenum is being focused on as a next generation low-resistivity material in the electronics field for the following reasons; 1) high melting point, 2) high thermal conductivity, 3) low coefficient of thermal expansion, and 4) low electrical resistivity. It is a candidate material for diffusion barrier, electrode, photomask, interconnect, or as a low-resistivity gate structure, and so on. A thin film that contains molybdenum can also be used in some organic light-emitting diodes, liquid crystal displays, and also in thin film solar cell and photovoltaic applications. In addition, not only pure Mo film, but also, Mo containing films, such as $Mo_nC$, $MoO_n$, and $MoN_n$, have the possibility to be used in several applications; eg. super conductor, single photon detector, capacitor in DRAM, diffusion barrier.

For background, some research groups have reported methods of forming Mo film by CVD/ALD techniques. In particular, $MoCl_5$ and $MoO_2Cl_2$ have been widely used as Mo sources. For example, the hydrogenolysis of molybdenum halide or molybdenum oxyhalide has been evaluated by several research groups using several Mo sources, such as $MoCl_5$, $MoOCl_4$ and $MoO_2Cl_2$. However, these processes form corrosive by-products (HCl), which results in undesirable etching, and/or damage to the other layers during the process. In addition, a research group at Helsinki University reported sequential CVD of $MoCl_5$ with Zn as a co-reactant, to avoid HCl formation. However, this method used metallic Zinc with the ampoule heated to 390° C. and with a high process temperature of 400~500° C., even though a sacrificial reagent is used. For a lower temperature deposition example, a research group of the University of Colorado has reported that Mo ALD process by using $MoF_6$ with disilane as co-reactant at 90~150° C. The process temperature was attractively lower than the traditional processes, but ~20% silicon contamination was found in the deposited film. In addition, potential etching effect by $MoF_6$, and the fluorosilane by-product may also be problematic Therefore, a corrosive-by-product free and low temperature Mo film deposition process is highly desired. Examples of organometallic molybdenum deposition precursors are limited; due to the difficulty of stabilizing the Mo center, and the relative ease of undergoing redox and disproportion reactions. Some examples in the literature are:

A Mo pure film CVD by using $Mo(CO)_6$ as precursor with $H_2O$ and $H_2$ as co-reactants at 500° C.

A metal forming method as catalytic deposition which used $Mo(R\text{-arene})_2$ with alkyl halide at around 400° C.

Although these reported processes showed the ability for the deposition of Mo-containing films, several challenges still remained, such as lower volatility, long-term thermal instability, the need for a liquid form, contamination of hetero atoms; especially carbon contamination by coordinated ligands, and poor reactivity during deposition. In addition, some known deposition materials were provided as a mixture which was formed as a complex synthesis product, the components of which were unable to be isolated; and forming azeotropic compounds or very similar physical properties. For quality control, spectrally pure chemicals are highly preferred because they can be prepared and provided with reliable verification.

Transition metal-alkyl bonds have been recognized as reactive towards nucleophilic reagents, due to their high polarization. In addition, bis-metal-alkyl species can be considered as synthetic precursors of alkanes and the two-electron reduced metal species through reductive elimination or radical reaction via thermal activation. These properties have been leveraged in the catalytic chemistry field, where metal-alkyl species have been used as pro-catalysts.

Scheme 1 Alkane and reduced metal formation from bis-alkyl-metal species

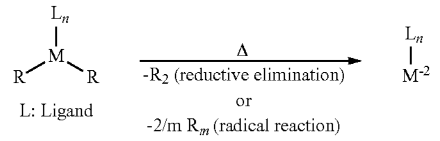

These unique properties are promising for deposition precursor design. However, the constraints for semiconductor applications are much tighter than for catalytic chemistry; furthermore, stability and scalability are also critical factors.

There are only a few demonstrated examples of pure group IV metal deposition processes by using metal-alkyl species. Major obstacles are the lower thermal stability of M-R bonds and the scalability of precursors.

Herein, $M({=}NR)_2R'_2$ are reported as promising molecules for corrosive by-product-free CVD/ALD application, due to having no corrosive functional group, scalability in synthesis, volatility, liquid at low temperature, and sufficient thermal stability. In addition, $M({=}NR)_2R'_2$ can be expected to form volatile organic compounds by heating, and be able to form amine from imide moiety by reacting with a sacrificial reagent.

SUMMARY OF THE INVENTION

The invention may be understood in relation to the following numbered embodiments:

1. A chemical suitable for use as a volatile precursor for vapor phase depositions of Mo or Cr containing materials, the chemical represented by one of the following formulae:

a)

Formula I

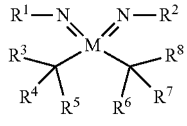

-continued b)

Formula II

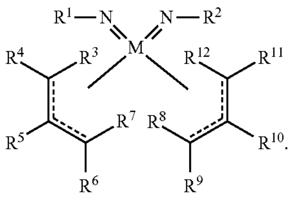

2. The chemical of claim 1, selected from Formula I.
3. The chemical of sentence 1, selected from formula II.
4. The chemical of sentence 1, selected from one or more of $Mo(NtBu)_2(CH_2SiMe_3)_2$, $Mo(NtBu)_2[CH_2Si(Me_2Et)]_2$, $Mo(NtBu)_2[CH_2Si(Me_2H)]_2$, $Mo(NtBu)_2Me_2$, $Mo(NtBu)_2Et_2$, $Mo(NtBu)_2(iPr)_2$, $Mo(NtBu)_2(iBu)_2$, $Mo(NtBu)_2(tBu)_2$, $Mo(NtBu)_2(allyl)_2$, $Mo(NtBu)_2(1\text{-}methylallyl)_2$, $Mo(NtBu)_2(2\text{-}methylallyl)_2$, $Mo(NtAmyl)_2(CH_2SiMe_3)_2$, $Mo(NtAmyl)_2[CH_2Si(Me_2Et)]_2$, $Mo(NtAmyl)_2Me_2$, $Mo(NtAmyl)_2Et_2$, $Mo(NtAmyl)_2(iPr)_2$, $Mo(NtAmyl)_2(iBu)_2$, $Mo(NtAmyl)_2((Bu)_2$, $Mo(NtAmyl)_2(allyl)_2$, $Mo(NtAmyl)_2(1\text{-}methylallyl)_2$, $Mo(NtAmyl)_2(2\text{-}methylallyl)_2$, $Mo(NPh)_2[CH_2SiMe_3]_2$, $Mo(NPh)_2Me_2$, $Mo(NPh)_2Et_2$, $Mo(NPh)_2(iPr)_2$, $Mo(NPh)_2(nBu)_2$, $Mo(NPh)_2(iBu)_2$, $Mo(NPh)_2((Bu)_2$, $Mo(NPh)_2(allyl)_2$, $Mo(NPh)_2(1\text{-}methylallyl)_2$. $Mo(NPh)_2(2\text{-}methylallyl)_2$, $Mo[N(SiMe_3)]_2[CH_2SiMe_3]_2$, $Mo[N(SiMe_3)]_2Me_2$, $Mo[N(SiMe_3)]_2Et_2$, $Mo[N(SiMe_3)]_2(iPr)_2$, $Mo[N(SiMe_3)]_2(iBu)_2$, $Mo[N(SiMe_3)]_2((Bu)_2$, $Mo[N(SiMe_3)]_2(allyl)_2$, $Mo[N(SiMe_3)]_2(1\text{-}methylallyl)_2$, $Mo[N(SiMe_3)]_2(2\text{-}methylallyl)_2$, $Cr[N(Si(Me_2Et)]_2(1\text{-}methylallyl)_2$, and $Cr[N(Si(Me_2Et)]_2(2\text{-}methylallyl)_2$.
5. The chemical of sentence 1, selected from one or more of $Mo(NtBu)_2(CH_2TMS)_2$, $Mo(NtAmyl)_2(CH_2TMS)_2$, $Mo(NtBu)_2(Me)_2$, and $Mo(NtBu)_2(allyl)_2$.
6. The chemical of sentence 1 having the formula $Mo(NtBu)_2(CH_2TMS)_2$.
7. A composition comprising the chemical of any one of sentences 1 to 6.
8. The composition of sentence 7, wherein the composition is a vapor phase composition.
9. The composition of sentence 8, wherein the vapor phase composition comprises a vapor of the chemical mixed with a carrier gas.
10. The composition of sentence 9, wherein the carrier gas comprises Argon.
11. The composition of sentence 9, further comprising a co-reactant gas capable of acting as a reducing agent.
12. The composition of sentence 11, wherein the co-reactant gas comprises ammonia gas and/or hydrogen gas.
13. The composition of sentence 7, wherein the chemical is >95% by weight of the composition, preferably >99%.
14. A method of vapor phase depositing a Mo or Cr containing material on a surface, the method comprising
    a) providing a substrate having a surface, and
    b) exposing the substrate to a vapor phase of the chemical of any one of sentences 1 to 6, under conditions suitable to form a deposited material, comprising the Mo or Cr, on the surface.

15. The method of sentence 14, wherein the deposited material is a contiguous and conformal film or layer on the surface of the substrate.
16. The method of sentences 14 or 15, further comprising exposing the surface of the substrate to a gaseous co-reactant capable of acting as a reducing agent, contemporaneously with, or subsequent to sentence 14, step b).
17. The method of sentence 16, wherein the gaseous co-reactant is ammonia or hydrogen.

DETAILED DESCRIPTION OF PREFERRED EMBODIMENTS

The disclosure describes two new genuses of chemical compounds suitable for use as volatile organometallic precursors for vapor phase deposition of Molybdenum containing films.

The generic formulae for the two genuses are:

Formula I

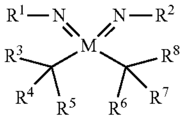

Formula II

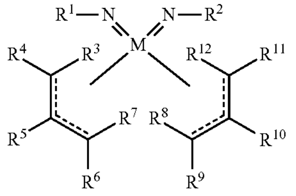

In the above two formulae:

M is Cr or Mo;

$R^1$, and $R^2$ each is independently selected from H, $C_1$-$C_6$ linear alkyl, $C_1$-$C_6$ branched alkyl, $C_1$-$C_6$ cyclic alkyl, $C_1$-$C_6$ alkenyl, $C_1$-$C_6$ alkylphenyl, $C_1$-$C_6$ alkenylphenyl, Aryl, or $-SiR^xR^yR^z$, wherein $R^x$, $R^y$, and $R^z$ each is independently selected from H, $C_1$-$C_6$ linear alkyl, $C_1$-$C_6$ branched alkyl, $C_1$-$C_6$ cyclic alkyl, $C_1$-$C_6$ alkenyl, $C_1$-$C_6$ alkylphenyl, $C_1$-$C_6$ alkenylphenyl, Aryl, F, Cl, Br, and I; and $R^3$, $R^4$, $R^5$, $R^6$, $R^7$, $R^8$; and in formula two $R^9$, $R^{10}$, $R^{11}$, and $R^{12}$, each is independently selected from H, $C_1$-$C_6$ linear alkyl, $C_1$-$C_6$ branched alkyl, $C_1$-$C_6$ cyclic alkyl, $C_1$-$C_6$ alkenyl, $C_1$-$C_6$ alkylphenyl, $C_1$-$C_6$ alkenylphenyl, Aryl, vinyl, or $-SiR^xR^yR^z$; wherein $R^x$, $R^y$, and $R^z$ each is independently selected from H, $C_1$-$C_6$ linear alkyl, $C_1$-$C_6$ branched alkyl, $C_1$-$C_6$ cyclic alkyl, $C_1$-$C_6$ alkenyl, $C_1$-$C_6$ alkylphenyl, $C_1$-$C_6$ alkenylphenyl, Aryl, F, Cl, Br, and I.

A non-exclusive, non-exhaustive set of specific examples includes: $Mo(NtBu)_2(CH_2SiMe_3)_2$, $Mo(NtBu)_2[CH_2Si(Me_2Et)]_2$, $Mo(NtBu)_2[CH_2Si(Me_2H)]_2$, $Mo(NtBu)_2Me_2$, $Mo(NtBu)_2Et_2$, $Mo(NtBu)_2(iPr)_2$, $Mo(NtBu)_2(iBu)_2$, $Mo(NtBu)_2((Bu)_2$, $Mo(NtBu)_2(allyl)_2$, $Mo(NBu)_2(1\text{-}methylallyl)_2$, $Mo(NtBu)_2(2\text{-}methylallyl)_2$, $Mo(NtAmyl)_2(CH_2SiMe_3)_2$, $Mo(NtAmyl)_2[CH_2Si(Me_2Et)]_2$, $Mo(NtAmyl)_2Me_2$, $Mo(NtAmyl)_2Et_2$, $Mo(NtAmyl)_2(iPr)_2$, $Mo(NtAmyl)_2(iBu)_2$, $Mo(NtAmyl)_2(tBu)_2$, $Mo(NtAmyl)_2(allyl)_2$, $Mo(NtAmyl)_2(1\text{-}methylallyl)_2$, $Mo(NtAmyl)_2(2\text{-}methylallyl)_2$, $Mo(NPh)_2[CH_2SiMe_3]_2$, $Mo(NPh)_2Me_2$, $Mo(NPh)_2Et_2$, $Mo(NPh)_2(iPr)_2$, $Mo(NPh)_2(nBu)_2$, Mo(NPh)$_2$(iBu)$_2$, Mo(NPh)$_2$(tBu)$_2$, Mo(NPh)$_2$(allyl)$_2$, Mo(NPh)$_2$(1-methylallyl)$_2$, Mo(NPh)$_2$(2-methylallyl)$_2$, Mo[N(SiMe$_3$)]$_2$[CH$_2$SiMe$_3$]$_2$, Mo[N(SiMe$_3$)]$_2$Me$_2$, Mo[N(SiMe$_3$)]$_2$Et$_2$, Mo[N(SiMe$_3$)]$_2$(iPr)$_2$, Mo[N(SiMe$_3$)]$_2$(iBu)$_2$, Mo[N(SiMe$_3$)]$_2$(tBu)$_2$, Mo[N(SiMe$_3$)]$_2$(allyl)$_2$, Mo[N(SiMe$_3$)]$_2$(1-methylallyl)$_2$, Mo[N(SiMe$_3$)]$_2$(2-methylallyl)$_2$, Cr[N(Si(Me$_2$Et)]$_2$(1-methylallyl)$_2$, and Cr[N(Si(Me$_2$Et)]$_2$(2-methylallyl)$_2$.

MODE(S) FOR CARRYING OUT THE INVENTION

The representative examples from the two genuses of chemicals were synthesized and evaluated according to the following general procedures.

Synthesis were performed under Nitrogen in an enclosure such as a glove box. The synthesis technique for producing the chemicals was adapted from known synthesis methods by substituting the ligand forming reactants. Schoettel, G., Kress, J., & Osborn, J. A. (1989). A simple route to molybdenum-carbene catalysts for alkene metathesis. Journal of the Chemical Society, Chemical Communications, (15), 1062-1063; Kingsley, A. J. (1998). Studies in early transition metal organometallic chemistry (Doctoral dissertation, Durham University).

Thermal properties measurements were performed as follows. Thermogravimetric Analysis (TGA) was performed at 25 to 500° C. under atmospheric pressure (1000 mBar, N2 220 sccm) with an Aluminium open cup.

Vapor pressure was determined against Naphthalene as an external standard.

Melting point and decomposition point were determined by Differential Scanning calorimetry (DSC) analysis in an Au-coated closed pan.

For vapor phase deposition, Mo(NR)$_2$R$_2$ was filled in a canister, and its vapors provided on substrates in a heated chemical vapor deposition chamber by supplying Ar carrier gas with or without co-reactants. Deposited films were evaluated by scanning electron microscopy (SEM) and X-ray photoelectron spectroscopy (XPS).

The following chemicals were synthesized and thermally evaluated:

| Molecule | Melting point (° C.) | Temp. VP = 1 torr (° C.) | Decomp. Temp. DSC (° C.) |
|---|---|---|---|
| Mo(NtBu)$_2$(CH$_2$TMS)$_2$ | <−50 | 103.5 | 240 |
| Mo(NtAmyl)$_2$(CH$_2$TMS)$_2$ | <−50 | 104.6 | 235 |
| Mo(NtBu)$_2$(Me)$_2$ | 123 (decomp.) | 80.8 | 123 |
| Mo(NtBu)$_2$(allyl)$_2$ | <−50 | 80.4 | 121 |

Deposition of Molybdenum-Containing Film Using Mo(NtBu)$_2$(CH$_2$TMS)$_2$

Mo(NtBu)$_2$(CH$_2$TMS)$_2$ was selected as a precursor to perform a representative vapor deposition of a Mo containing film. The precursor source was kept at 93° C. with a argon carrier gas flow of 50 sccms and flowed for 30 min during experiments. The co-reactants used were hydrogen and ammonia gas. In all the examples, the CVD reactor pressure was set as 10 Torr. The substrates used were silicon dioxide films (100 nm on silicon wafer).

Deposited Components by Each CoReactant[a]

| Co-reactants | Film thickness [nm][b] | Mo [%][c] | C [%][c] | N [%][c] | Si [%][c] | O [%][c,d] |
|---|---|---|---|---|---|---|
| Pyrolysis | 13 | 18 | 28 | 20 | 8 | 21 |
| $H_2$ CVD | 25 | 22 | 22 | 23 | 14 | 18 |
| $NH_3$ CVD | 42 | 31 | 8 | 35 | 8 | 18 |

[a]Each process was performed be follow conditions, substrate: 100 nm SiO$_2$/Si, substrate temperature: 432° C., time: 30 minutes, canister temperature: 93° C., carrier gas flow: Ar, 50 sccm, co-reactants flow: 100 sccm, reactor pressure: 10 torr;
[b]determined by SEM measurement;
[c]determined by XPS measurement;
[d]source of oxygen contamination was identified as air-break by capping experiment.

To prevent Oxygen incorporation, the same procedure was followed with the addition of a Ru capping layer. Industrially, this corresponds to how the Mo films will normally be incorporated into a product. The atomic ratios for the Ru capped Mo containing films (normalized to the Mo content) are in the following table.

| Co-reactants | Film thickness [nm]b | % Mo | Atomic Ratio |
|---|---|---|---|
| Pyrolysis | 69 | 23 | $MoC_{2.3}N_{1.2}Si_{0.7}$ |
| $H_2$ CVD | 112 | 25 | $MoC_{1.5}N_{1.2}Si_{0.7}$ |
| $NH_3$ CVD | 66 | 26 | $MoC_{0.6}N_{1.3}Si_{0.5}$ |

INDUSTRIAL APPLICABILITY

The present invention is at least industrially applicable to the vapor phase deposition of Mo containing films, in particular MoN films.

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims. The present invention may suitably comprise, consist or consist essentially of the elements disclosed and may be practiced in the absence of an element not disclosed. Furthermore, if there is language referring to order, such as first and second, it should be understood in an exemplary sense and not in a limiting sense. For example, it can be recognized by those skilled in the art that certain steps can be combined into a single step.

The singular forms "a", "an" and "the" include plural referents, unless the context clearly dictates otherwise.

"Comprising" in a claim is an open transitional term which means the subsequently identified claim elements are a nonexclusive listing (i.e., anything else may be additionally included and remain within the scope of "comprising"). "Comprising" as used herein may be replaced by the more limited transitional terms "consisting essentially of" and "consisting of" unless otherwise indicated herein.

"Providing" in a claim is defined to mean furnishing, supplying, making available, or preparing something. The step may be performed by any actor in the absence of express language in the claim to the contrary.

Optional or optionally means that the subsequently described event or circumstances may or may not occur. The description includes instances where the event or circumstance occurs and instances where it does not occur.

Ranges may be expressed herein as from about one particular value, and/or to about another particular value. When such a range is expressed, it is to be understood that another embodiment is from the one particular value and/or to the other particular value, along with all combinations within said range.

All references identified herein are each hereby incorporated by reference into this application in their entireties, as well as for the specific information for which each is cited.

The invention claimed is:

1. A composition comprising a chemical suitable for use as a volatile precursor for vapor phase depositions of Mo or Cr containing materials, the chemical represented by one of the following formulae:

a)

Formula I

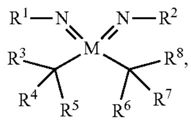

b)

Formula II

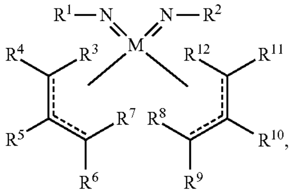

wherein for both formulae,

M is Cr or Mo;

$R^1$, and $R^2$ each is independently selected from H, $C_1$-$C_6$ linear alkyl, $C_1$-$C_6$ branched alkyl, $C_1$-$C_6$ cyclic alkyl, $C_1$-$C_6$ alkenyl, $C_1$-$C_6$ alkylphenyl, $C_1$-$C_6$ alkenylphenyl, Aryl, or —SiRxRyRz, wherein Rx, Ry, and Rz each is independently selected from H, $C_1$-$C_6$ linear alkyl, $C_1$-$C_6$ branched alkyl, $C_1$-$C_6$ cyclic alkyl, $C_1$-$C_6$ alkenyl, $C_1$-$C_6$ alkylphenyl, $C_1$-$C_6$ alkenylphenyl, Aryl, F, Cl, Br, and I; and $R^3$, $R^4$, $R^5$, $R^6$, $R^7$, $R^8$; and in formula two $R^9$, $R^{11}$, $R^{11}$, and $R^{12}$, each is independently selected from H, $C_1$-$C_6$ linear alkyl, $C_1$-$C_6$ branched alkyl, $C_1$-$C_6$ cyclic alkyl, $C_1$-$C_6$ alkenyl, $C_1$-$C_6$ alkylphenyl, $C_1$-$C_6$ alkenylphenyl, Aryl, vinyl, or —SiRxRyRz; wherein Rx, Ry, and Rz each is independently selected from H, $C_1$-$C_6$ linear alkyl, $C_1$-$C_6$ branched alkyl, $C_1$-$C_6$ cyclic alkyl, $C_1$-$C_6$ alkenyl, $C_1$-$C_6$ alkylphenyl, $C_1$-$C_6$ alkenylphenyl, Aryl, F, Cl, Br, and I, further wherein the composition is a vapor phase composition.

2. The composition of claim 1, wherein the chemical is selected from Formula I.

3. The composition of claim 1, wherein the chemical is selected from Formula II.

4. The composition of claim 1, wherein the chemical is selected from one or more of $Mo(NtBu)_2(CH_2SiMe_3)_2$, $Mo(NtBu)_2[CH_2Si(Me_2Et)]_2$, $Mo(NtBu)_2[CH_2Si(Me_2H)]_2$, $Mo(NtBu)_2Me_2$, $Mo(NtBu)_2Et_2$, $Mo(NtBu)_2(iPr)_2$, $Mo(NtBu)_2(iBu)_2$, $Mo(NtBu)_2((Bu)_2$, $Mo(NtBu)_2(allyl)_2$, $Mo(NtBu)_2(1\text{-methylallyl})_2$, $Mo(NtBu)_2(2\text{-methylallyl})_2$, $Mo(NtAmyl)_2(CH_2SiMe_3)_2$, $Mo(NtAmyl)_2[CH_2Si(Me_2Et)]_2$, $Mo(NtAmyl)_2Me_2$, $Mo(NtAmyl)_2Et_2$, $Mo(NtAmyl)_2(iPr)_2$, $Mo(NtAmyl)_2(iBu)_2$, $Mo(NtAmyl)_2((Bu)_2$, $Mo(NtAmyl)_2(allyl)_2$, $Mo(NtAmyl)_2(1\text{-methylallyl})_2$, $Mo(NtAmyl)_2(2\text{-methylallyl})_2$, $Mo(NPh)_2[CH_2SiMe_3]_2$, $Mo(NPh)_2Me_2$, $Mo(NPh)_2Et_2$, $Mo(NPh)_2(iPr)_2$, $Mo(NPh)_2(nBu)_2$, $Mo(NPh)_2(iBu)_2$, $Mo(NPh)_2(Bu)_2$, $Mo(NPh)_2(allyl)_2$, $Mo(NPh)_2(1\text{-methylallyl})_2$, $Mo(NPh)_2(2\text{-methylallyl})_2$, $Mo[N(SiMe_3)]_2[CH_2SiMe_{3]2}$, $Mo[N(SiMe_3)]_2Me_2$, $Mo[N(SiMe_3)]_2Et_2$, $Mo[N(SiMe_3)]_2(iPr)_2$, $Mo[N(SiMe_3)]_2(iBu)_2$, $Mo[N(SiMe_3)]_2(tBu)_2$, $Mo[N(SiMe_3)]_2(allyl)_2$, $Mo[N(SiMe_3)]_2(1\text{-methylallyl})_2$, $Mo[N(SiMe_3)]_2(2\text{-methylallyl})_2$, $Cr[N(Si(Me_2Et)]_2(1\text{-methylallyl})_2$, and $Cr[N(Si(Me_2Et)]_2(2\text{-methylallyl})_2$.

5. The composition of claim 1, wherein the chemical is selected from one or more of $Mo(NtBu)_2(CH_2TMS)_2$, $Mo(NtAmyl)_2(CH_2TMS)_2$, $Mo(NtBu)_2(Me)_2$, and $Mo(NtBu)_2(allyl)_2$.

6. The composition of claim 1, wherein the chemical is $Mo(NtBu)_2(CH_2TMS)_2$.

7. The composition of claim 4, wherein the vapor phase composition comprises a vapor of the chemical mixed with a carrier gas.

8. The composition of claim 5, wherein the vapor phase composition comprises a vapor of the chemical mixed with a carrier gas.

9. The composition of claim 1, wherein the vapor phase composition comprises a vapor of the chemical mixed with a carrier gas.

10. The composition of claim 9, wherein the carrier gas having Argon.

11. The composition of claim 9, further comprising a co-reactant gas capable of acting as a reducing agent.

12. The composition of claim 11, wherein the co-reactant gas has ammonia gas and/or hydrogen gas.

13. The composition of claim 1, wherein the chemical is >95% by weight of the composition.

14. A method of vapor phase depositing a Mo or Cr containing material on a surface, the method comprising:

a) providing a substrate having a surface, and b) exposing the substrate to a vapor phase of a composition comprising a chemical suitable for use as a volatile precursor for vapor phase depositions of Mo or Cr containing materials, the chemical represented by one of the following formulae:

Formula I

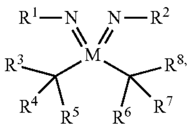

Formula II

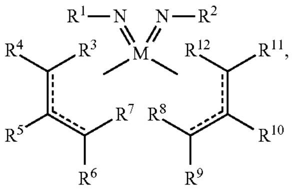

wherein for both formulae,

M is Cr or Mo;

$R^1$, and $R^2$ each is independently selected from H, $C_1$-$C_6$ linear alkyl, $C_1$-$C_6$ branched alkyl, $C_1$-$C_6$ cyclic alkyl, $C_1$-$C_6$ alkenyl, $C_1$-$C_6$ alkylphenyl, $C_1$-$C_6$ alkenylphenyl, Aryl, or —SiRxRyRz, wherein Rx, Ry, and Rz each is independently selected from H, $C_1$-$C_6$ linear alkyl, $C_1$-$C_6$ branched alkyl, $C_1$-$C_6$ cyclic alkyl, $C_1$-$C_6$ alkenyl, $C_1$-$C_6$ alkylphenyl, $C_1$-$C_6$ alkenylphenyl, Aryl, F, CI, Br, and I; and $R^3$, $R^4$, $R^5$, $R^6$, $R^7$, $R^8$, and in formula two $R^9$, $R^{10}$, $R^{11}$, and $R^{12}$, each is independently selected from H, $C_1$-$C_6$ linear alkyl, $C_1$-$C_6$ branched alkyl, $C_1$-$C_6$ cyclic alkyl, $C_1$-$C_6$ alkenyl, $C_1$-$C_6$ alkylphenyl, $C_1$-$C_6$ alkenylphenyl, Aryl, vinyl, or —SiRxRyRz; wherein Rx, Ry, and Rz each is independently selected from H, $C_1$-$C_6$ linear alkyl, $C_1$-$C_6$ branched alkyl, $C_1$-$C_6$ cyclic alkyl, $C_1$-$C_6$ alkenyl, $C_1$-$C_6$ alkylphenyl, $C_1$-$C_6$ alkenylphenyl, Aryl, F, CI, Br, and I, under conditions suitable to form a deposited material, having the Mo or Cr, on the surface.

15. The method of claim 14, wherein the deposited material is a contiguous and conformal film or layer on the surface of the substrate.

16. The method of claims 14, further comprising exposing the surface of the substrate to a gaseous co-reactant capable of acting as a reducing agent, contemporaneously with, or subsequent to claim 14, step b).

17. The method of claim 16, wherein the gaseous co-reactant is ammonia or hydrogen.

* * * * *